United States Patent [19]

Blackwood et al.

[11] Patent Number: 4,749,440
[45] Date of Patent: Jun. 7, 1988

[54] GASEOUS PROCESS AND APPARATUS FOR REMOVING FILMS FROM SUBSTRATES

[75] Inventors: Robert S. Blackwood; Rex L. Biggerstaff, both of Lubbock, Tex.; L. Davis Clements, Lincoln, Nebr.; C. Rinn Cleavelin, Lubbock, Tex.

[73] Assignees: FSI Corporation, Chaska, Minn.; Texas Instruments Incorporated, Dallas, Tex.

[21] Appl. No.: 48,952

[22] Filed: May 12, 1987

Related U.S. Application Data

[63] Continuation of Ser. No. 770,277, Aug. 28, 1985, abandoned.

[51] Int. Cl.$^4$ .................. B44C 1/22; C03C 15/00; C03C 25/06
[52] U.S. Cl. ......................... 156/646; 134/3; 134/33; 134/157; 156/653; 156/657; 156/662; 156/345; 252/79.1; 252/79.3
[58] Field of Search .................. 252/79.1, 79.3; 134/2, 134/3, 4, 28, 30, 31, 33, 102, 201, 157; 156/643, 646, 653, 655, 657, 662, 345; 65/31

[56] References Cited

U.S. PATENT DOCUMENTS

| | | | |
|---|---|---|---|
| 3,672,980 | 6/1972 | Glendinning | 117/201 |
| 3,711,324 | 1/1973 | Glendinning | 117/201 |
| 3,718,503 | 2/1973 | Glendinning | 117/212 |
| 3,773,578 | 11/1973 | Glendinning | 156/646 |
| 3,879,597 | 4/1975 | Bersin et al. | 219/121 P |
| 3,923,568 | 12/1975 | Bersin | 252/79.1 X |
| 4,127,437 | 11/1978 | Bersin et al. | 156/635 |
| 4,148,705 | 4/1979 | Battey et al. | 204/192 E |
| 4,255,229 | 3/1981 | Morcom | 156/662 X |
| 4,264,374 | 4/1981 | Beyer | 134/3 |
| 4,285,800 | 8/1981 | Welty | 204/298 |
| 4,303,467 | 12/1981 | Scornavacca | 156/643 |
| 4,313,783 | 2/1982 | Davies | 152/643 |
| 4,389,281 | 6/1983 | Anantha et al. | 156/646 |
| 4,415,404 | 11/1983 | Riegl | 156/635 |
| 4,444,605 | 4/1984 | Slawinski | 148/187 |
| 4,465,552 | 8/1984 | Bobbio et al. | 156/643 |
| 4,467,450 | 8/1984 | Kuo | 365/149 |
| 4,468,283 | 8/1984 | Ahmed | 156/642 |
| 4,490,209 | 12/1984 | Hartman | 156/643 |
| 4,505,949 | 3/1985 | Jelks | 427/38 |
| 4,605,479 | 8/1986 | Faith | 204/172 D |

FOREIGN PATENT DOCUMENTS 1041164 10/1958 Fed. Rep. of Germany .

OTHER PUBLICATIONS

IBM Technical Disclosure Bulletin, vol. 19, No. 7, Dec. 1976, K. D. Beyer "Etching SiO$_2$ in Gaseous HF/H$_2$" p. 2513.

IBM Technical Disclosure Bulletin, vol. 22, No. 7, Dec. 1979, K. D. Beyer "Removal of Native Oxide Layer on a Semiconductor Surface", p. 2839.

(List continued on next page)

Primary Examiner—William A. Powell
Attorney, Agent, or Firm—Palmatier & Sjoquist

[57] ABSTRACT

A process for removing at least a portion of a film from a substrate, such as a wafer of silicon or other similar materials, the film on the substrate typically being an oxide film, maintaining the atmosphere embracing the substrate at near room temperature and at near normal atmospheric pressure, flowing dry inert diluent gas over the substrate, introducing a flow of reactive gas, preferably an anhydrous hydrogen halide gas, namely anhydrous hydrogen flouride gas, for typically 5 to 30 seconds over the substrate and film to cause the removal of portions of the film, flowing water vapor laden inert gas, preferably nitrogen, over the substrate and film from a time prior to commencing flow of the reactive gas until flow of the reactive gas is terminated. In the case of non-hygroscopic film on the substrate, the flow of water vapor continues during the flow of the reactive gas and is terminated shortly after the termination of the flow of reactive gas. In the case of hygroscopic film, the flow of water vapor is discontinued prior to the start of flow of the reactive gas. In carrying out the process, a process chamber is needed to confine the substrate and have a vent, which though restricted, continuously open to the atmosphere.

59 Claims, 2 Drawing Sheets

OTHER PUBLICATIONS

Patents Abstracts of Japan, vol. 5, No. 159, Oct. 14, 1981, p. 831 & JP A, 56-88320, (FUJITSU), Jul. 17, 1981.

MaJun-Ru et al., "A New Conformal Dry-Etch Technique for Submicrometer Structures", *J. Vac. Sci. Technol.*, 19(4), Nov. Dec. 1981, pp. 1385-1389.

Tyapkina et al., "Interaction of a Silicon Surface with Fluorine and Hydrogen Fluoride", *Russian Journal of Physical Chem.*, U.D.C. 541 124/128, May 1966, pp. 573-576.

Arslambekov et al., "Reaction of Si with Gaseous HF", *Izvest-Akademii Nauk SSSR, Neorganicheskie Materialy*, vol. 12, No. 12, pp. 2124-2126, Dec. 1976, pp. 1737-1739.

Bersin et al., "The Dry Ox Process for Etching Silicon Dioxide", *Solid State Technology*, Apr. 1977, 20(4), pp. 78-80.

Abstract, Japan Kokai Tokyo Koho 79, 125, 143, Sep. 28, 1979.

Abstract, Japan Kokai Tokyo Koho 79, 125, 144, Sep. 28, 1979.

Beyer, "Silicon Surface Cleaning Process", *IBM Technical Disclosure Bulletin*," vol. 20, No. 5, Oct. 1977, pp. 1746-1747.

Inoue, "Etching of Germanium with Water Vapor", *Japanese Journal of Applied Physics*, vol. 11, No. 6, Aug. 1972, pp. 1147-1152.

Bhat et al., "Vapor-Phase Etching and Polishing of Gallium Arsenide Using Hydrogen Chloride Gas", *J. Electrochem. Soc.: Solid State Science & Technology*, vol. 122, No. 10, Oct. 1975, pp. 1378-1382.

Levin et al., "Electron Microscope Characterization of Defects on Gaseous-Etched Silicon Surfaces", *J. Electrochem. Soc.*, vol. 118, No. 7, pp. 1171-1175.

Dismukes et al., "Gas-Phase Etching of Silicon with Chlorine", *J. Electrochem. Soc.*, vol. 118, No. 4, pp. 634-635.

Lin et al., "Vapor Phase Etching of GaAs in the $H_2$—$H_2O$ Flow System", *J. Electrochem. Soc.*, vol. 117, No. 3, pp. 407-409.

Chu et al., "The Etching of Germanium with Water Vapor and Hydrogen Sulfide", *J. Electrochem. Soc.*, vol. 116, No. 9, pp. 1261-1263.

GASEOUS PROCESS AND APPARATUS FOR REMOVING FILMS FROM SUBSTRATES

This is a continuation of co-pending application Ser. No. 770,277 filed on Aug. 28, 1985, now abandoned.

BACKGROUND OF THE INVENTION

This invention relates to the process of removing films from substrate materials with reactive gases. More particularly, this invention is concerned with etching substrates (e.g., silicon or polysilicon) to remove from the surface thereof layers or films (e.g., oxides or nitrides of silicon and polysilicons) by action of anhydrous reactive gases, for example anhydrous hydrogen fluoride. The process according to this invention is highly important in the processing of silicon wafers used in the manufacture of semi-conductor integrated circuit chips as well as in other industrial etching and cleaning processes.

Currently, the etching process in the manufacture of semiconductor integrated circuit chips and thin film circuitry has been conducted in a wet acid etching procedure or with plasma techniques. One method of wet etching has been to overlay the surface to be etched with a suitable photoresist mask and to immerse the circuit so masked in a chemical solution which attacks the surface to be etched while leaving the mask otherwise intact. Alternatively, the acid is sprayed onto the surface to be etched. With these known wet etching procedures, etching proceeds at rates at the approximate range of 50 to 2000 angstroms per minute, and is controllable in that range. It has been difficult with the chemical etching processes presently known to achieve well-defined edges on the etched surfaces. The difficulty arises because the chemical action of the wet etchant tends to etch isotropically, i.e., it undercuts the mask by the same distance that it penetrates the underlayer, and thus reduces the final feature dimensions. It is therefore, very difficult to use wet chemical etching to achieve fine structures.

An additional problem in wet etching is that at completion of the etching process, thorough rinsing of the wafers is required to remove residual etchant and other contaminants. Accordingly, after the wafers have been etched, they must be cleaned in a separate step, and cleaning contributes to a particulate problem, especially as relates to heavy metals which may be collected on the surface of the wafer. The steps involved in cleaning wafers after etching involve the use of chemicals such as hydrogen chloride and hydrogen peroxide, or ammonium hydroxide and hydrogen peroxide. These cleaning agents must be rinsed from the surface of the wafers subsequent to the cleaning.

In addition, the wet etching of wafers presents other problems which are difficult to deal with. For instance, liquid etchant and rinse media present serious environmental disposal considerations. In most instances these etchant and rinse media must be collected and disposed of in accordance with strict governmental regulations.

In an effort to alleviate these and other problems associated with previous wet liquid etching techniques, various researchers have endeavored to develop gas phase process procedures utilizing a gaseous etchant medium. Known gas phase methods for etching wafers are plasma etching or reactive ion etching (RIE), wherein a vacuum container is filled with a low pressure gas. A surface or substrate to be etched is covered by a photoresist mask and inserted into the container along with the reactive etchant gas. To perform the etching procedure, a voltage is applied to excite the gas, thereby dissociating it and forming various positive and negative ions, reactive neutral species and electrons. The dissociated species interact with the surface to be etched producing various gaseous reaction products.

One significant problem encountered in plasma etching of silicon oxide is that by using the plasma procedures, the underlying layer on the wafer is etched. As a result, when etching of the oxide film has been completed, etching of the underlying layers in the substrate will continue and produce a roughened, damaged surface due to the additional etching.

The ability to etch thin lines and space widths (3 microns or less) in silicon dioxide over silicon is an important aspect of the plasma or RIE processes used in microcircuit manufacture. However, certain definite drawbacks exist in plasma or RIE techniques. The various plasma generating compositions used as the etchant medium have not yielded consistently satisfactory results. Use of the plasma etching technique necessitates various expensive facilities and controls, for providing and regulating the high voltage required, and the vacuum and temperature conditions that are essential. These disadvantages pertaining to plasma etching have led researchers to investigate economically attractive alternatives using gaseous etchants under various conditions.

Certain Russian writers, V. V. Tyapkina and N. S. Guseva reported in an article INTERACTION OF A SILICON SURFACE WITH FLUORINE AND HYDROGEN FLUORIDE, published in the May 1966 issue of RUSSIAN JOURNAL OF PHYSICAL CHEMISTRY, investigating a dry etching procedure utilizing anhydrous hydrogen fluoride with a carrier gas, involving pretreatment of the surface to be etched with gaseous fluorine, prior to introduction of the hydrogen fluoride gas at about 240° C. These Russian researchers investigated the reaction mechanism involved, suggesting that four reaction steps occur when hydrogen fluoride reacts with silicon oxide and silicon dioxide, ultimately yielding silicon hexafluoride and water. However, the Russian workers were unable to achieve a satisfactory removal rate or control. Their process is not acceptable for the fine precision and reproducibility necessary in the production of semi-conductor circuitry.

In a later article, Russian writers V. A. Arslambekov, K. M. Gorbunova, and N. S. Guseva reported in Izv. Akad. Nauk SSR, Neorgan. Mat., Volume 12, No. 12, pp. 2124–2126, December 1976, certain work related to the reaction of silicon with gaseous hydrogen fluoride. At pressures of 100 torr and temperatures from 180° C. to 400° C., removal rates were exceedingly slow and quite unsatisfactory.

Another gas phase process for etching silicon dioxide (the DryOx process) was reported by R. Bersin and R. Reichelderfer, Solid State Technol., 1977, 20(4), 78–80; and also reported in U.S. Pat. No. 4,127,437. They attempted to use anhydrous hydrogen fluoride in a dry process for etching silicon dioxide without damaging the underlaying silicon substrate. Their conclusion was that both heating and the use of a vacuum reaction chamber were necessary in controlling the reaction. However, this process still lacked the removal rate that is compatible for manufacturing necessary uniformity of removal rate and control.

Japan Kokai Tokyo Koho No. 79,125,143, Sept. 28, 1979, disclosed a hydrogen fluoride gas etching apparatus, wherein the etching chamber is evacuated, the material to be etched is cooled to 20° C. or less, and the etching chamber is then filled with HF to a pressure of 2.0 torr. The process specifically requires that the piece to be etched is mounted on an aluminum plate which is fixed on a thermoelement. Thermocouples are connected to the aluminum supporting plate to control electric current fed to the thermoelement. The purpose is to refrigerate and lower the temperature of the wafer.

Japan Kokai Tokyo Koho No. 79,125,144, Sept. 28, 1979, discloses a related hydrogen fluoride gas etching apparatus, wherein the etching chamber is evacuated, the material to be etched is cooled to between 0° C. to −30° C., and the etching chamber is filled with cold (−30° C.) HF under 5.0 torr. As in the related process described in the paragraph immediately above, this process specifically requires that the material to be etched is mounted on an aluminum supporting plate which is fixed on a thermoelement. Thermocouples are connected to aluminum supporting plate to control electric current fed to the thermoelement.

These previous halogen-containing gas phase etching processes all require specific controls of electric voltage, current, pressure and temperature, and still do not achieve satisfactory control and uniformity of removal rate necessary in the production of semi-conductor materials.

SUMMARY OF THE INVENTION

An object of the present invention is to provide a process for gas phase etching or cleaning of substrates for removal of films or layers subject to attack by various reactive gases, and which has the economically and operationally desirable feature of operating near ambient conditions while achieving a controllable, repeatable and uniform result.

Basically the present process comprises exposing of the substrate at near normal atmospheric pressure and room temperature to a continuously flowing atmosphere of anhydrous reactive gas preferably anhydrous hydrogen fluoride gas mixed with a dry inert diluent gas and a water vapor laden inert gas. Care is taken to be assured that water vapor laden inert gas, preferably nitrogen, is flowing from a water vapor chamber, for mixing with the dry inert gas, preferably nitrogen, at a time prior to commencing flow of the anhydrous hydrogen fluoride gas and until the flow of hydrogen fluoride gas is terminated.

In accordance with the invention it has been discovered that mixing an anhydrous reactive gas with the inert gas and/or water vapor laden inert gas allows for repeatable, uniform and controllable etching at near ambient conditions. The procedure according to the present invention is used in etching oxide or nitride layers or films of silicon, polysilicon, gallium arsenide, transition metals, aluminum or various silicide films on various materials in the manufacture of integrated circuit chips.

According to the present invention, the substrate to be etched is confined within a process chamber continuously vented to atmosphere as to maintain the pressure in the chamber at "near normal atmospheric pressure". The near normal atmospheric pressure conditions in the process chamber may be actual atmospheric pressure or slightly above atmospheric pressure as may be obtained by utilizing a control device such as a throttle valve at the vent of the chamber. The process chamber pressure may be up to about thirty five inches of water above atmospheric pressure with satisfactory results. The process chamber is maintained at substantially room temperature; and no heating of the process chamber is effected. The substrate having the film or layer to be removed or geometry pattern to be etched is placed in the processing chamber. The process chamber and the system gas flow lines are all purged with a flow of dry inert gas. Then, a mixture of anhydrous reactive gas, dry inert gas and possibly an additional water vapor laden inert gas is flowed into the process chamber. The flow of reactive gas causes the etching or removal of the film. The flow is continued in most instances for a time of five to thirty seconds. When etching is completed, the flow of reactive gas is terminated and the reactive gas is purged from the process chamber to stop the etch.

A specific example of reactive gas processing utilizes anhydrous hydrogen fluoride gas for etching silicon dioxide films or other etchable films. An inert gas such as nitrogen with a controlled humidity is mixed with the anhydrous hydrogen fluoride gas. This mixture of gases is flowed into the process chamber which is maintained at substantially room temperature and near normal atmospheric pressure conditions. The processing chamber is continuously vented and is thereby maintained at substantially atmospheric pressure. Process chamber pressure will nominally exceed atmospheric pressure by that required to maintain continuous flow against the small back pressure developed by the restriction of the vent. Alternatively by a control device at the vent, process chamber pressure may be increased to twenty five to thirty five inches of water. The water vapor in the inert gas initiates and supports the interaction between the anhydrous hydrogen fluoride and the film on the substrate to be etched.

The etching of the film or layer from the substrate is repeatable and controllable in etching a series of substrates and in each substrate, and etching is substantially uniform across the surface of the substrate. The etching is controllable across a wide range of etch rates. As an example, on silicon dioxide, removal rates of from 100 angstroms per minute to 14,000 angstroms per minute have been achieved. The processing chamber may contain a single wafer or multiple wafers being simultaneously processed.

Another aspect of the invention is an improved product formed by the process described herein. The improved product has a combination of characteristics not previously found in prior products.

Among the combination of important characteristics are the smooth surface of the silicon substrate upon completion of the etch, and without damage or roughening of the surface due to the etch; the narrow line widths in geometry etching; and the increased level of free fluorine atoms on the surface of the silicon after completion of the etch.

The improved product comprises a filmed substrate having at least a portion of the film removed by exposing the substrate to an anhydrous reactive gas in the presence of water vapor and at near room temperature and near normal atmospheric pressure. More specifically the improved product comprises a silicon wafer with at least a portion of its oxide or nitride film removed by exposing the substrate and film to an anhydrous hydrogen halide gas such as anhydrous hydrogen fluoride in the presence of water vapor, preferably water vapor carried by dry nitrogen gas or other inert gas.

This improved product and its characteristics provide the advantage of being highly suitable for preparation of high quality circuit chips.

Still another aspect of the invention is a processing apparatus for removing films from substrates. The features of the invention are a continuously vented and openable processing chamber maintained at near room temperature for housing the substrate to be processed. Valved sources of reactive gas such as anhydrous hydrogen fluoride and of purging inert gas such as dry nitrogen are connected to the process chamber. A valved source of water vapor is also connected to be carried with at least a portion of the inert gas into the process chamber. Preferably the source of anhydrous reactive gas and its flow control are heated to assure against condensation of the gas.

The processing apparatus provides the advantage of facilitating the selective etching of films from substrates with a minimum of mechanism and under conditions requiring only a minimum of controls. The etching obtained through the use of the apparatus results in an improved product for the production of high quality circuit chips.

DETAILED DESCRIPTION OF THE INVENTION

Figure 1:
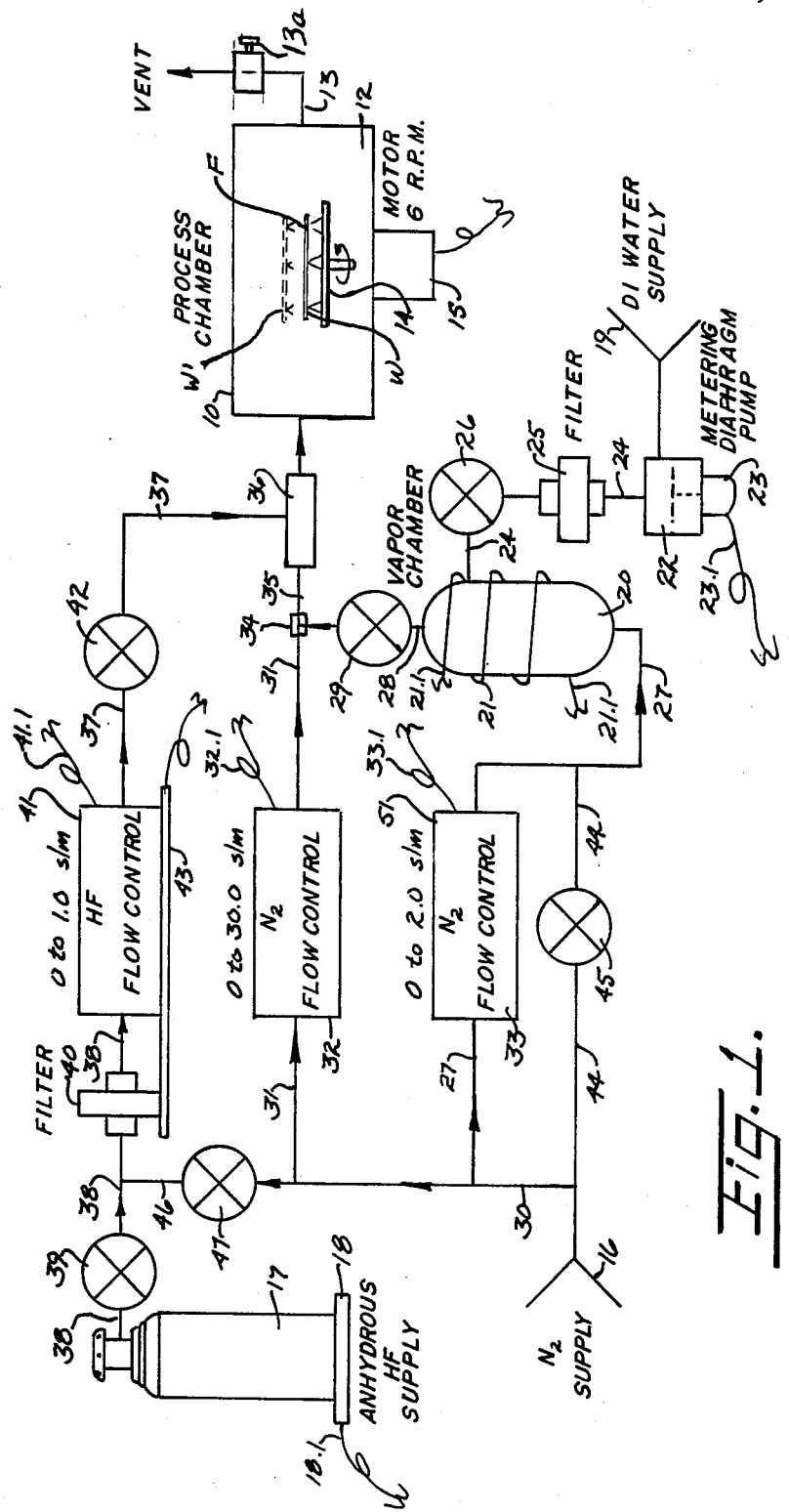
FIG. 1 is a schematic diagram of an apparatus for carrying out the process of the invention.

The substrate materials which can be treated by the present process can, generally, be any type of substrate material which will be unaffected by the halogen-containing gaseous etchant medium. When the substrate material is a wafer to be processed in the manufacture of integrated circuit chips, it will typically be composed of such materials as silicon, polysilicon, garnet, binarys such as gallium arsenide and indium phosphide, also ternarys such as CdHgTe, GaAlAs and GaInP, and quaternarys such as GaInAsP. Other substrate materials which may be treated by this etching, cleaning, and/or polishing process include stainless steel, quartz, aluminum, germanium, gallium and selenium.

Such wafer substrates may be etched one at a time, or a plurality may be etched simultaneously as illustrated in the drawing. An entire boat or carrier of twenty-five wafers may be simultaneously etched in a larger processing chamber.

These different substrates can have films with varying characteristics. The oxide films on silicon wafers may be thermally grown, by application of oxygen under high temperature conditions; or may be vapor generated with steam and oxygen at elevated temperatures; or the film may result from a chemical vapor deposition process. In addition, the oxide films on the silicon wafers may be doped with such materials as phosphorous, arsenic, or boron. These different films may be etched with this invention. It has been specifically found that films doped with phosphorous will etch with this present invention. Most of the work and etching according to the invention has been done in connection with the oxygen and vapor grown films.

It has been found that the thermally grown films are the most dense and have the slowest etch rate, requiring some adjustment in the concentration of the reactive gas in the etching process. The vapor generated films grown in vapor and oxygen at elevated temperatures are common films encountered in etching silicon wafers and are considered to be rather typical of the films etched. These vapor generated films are more readily etched at lower concentrations of the reactive gas than are required for etching the thermally grown films. The films produced by chemical vapor deposition are less dense than the usual films encountered and are rapidly etched with low concentrations of the reactive gas.

The doped films are highly etchable with anhydrous reactive gas, such as anhydrous hydrogen fluoride gas and require only dilute concentrations of the reactive gas to accomplish the necessary etching. Such doped films are hygroscopic and may be readily etched without the addition of water vapor mixed with the inert gas.

Silicon substrates may have a layer of polysilicon thereon, and the polysilicon may have an oxide film thereon which may be partially or entirely etched away in the same manner as silicon dioxide is etched.

This gaseous treatment invention is also suitable for removing any of the above mentioned materials. For example, quartz boats, which are used to support a multiplicity of wafers in various processing procedures in the manufacture of integrated circuit chips, develop undesirable oxide and nitride layers which must be removed in normal maintenance. One method for cleaning a large number of boats requires a large stainless steel chamber able to accommodate approximately 50 to 60 such boats. The chamber is evacuated, heated to approximately 400° C., and injected with anhydrous hydrogen fluoride, to remove accumulated oxides and nitrides. This prior art process is very slow, the equipment very expensive, and the hydrogen fluoride backs up into vacuum pumps, deteriorating them and causing difficult maintenance problems. By providing a process chamber large enough to accommodate these quartz boats, the present disclosed process can easily be used to effect cleaning thereof.

The present process can be used for etching, cleaning and/or polishing any of the above mentioned substrates. For example, this process may be used for preparing the interior surface of glass or silica substrate tubes to be coated for the manufacture of optical waveguides.

The inert gas used in the present process may be any gas which is inert to the materials to be treated and which will remain in the gaseous phase under the process conditions present. Suitable gases include nitrogen, argon, neon, helium, krypton and xenon. A particularly preferred inert gas according to the present invention is nitrogen. It is preferred to use pure nitrogen in the present process, such as chromatographic nitrogen or nitrogen which meets Semi Specifications. Semi nitrogen specifications are as follows:

|  | Bulk Grade | VLSI Grade |
| --- | --- | --- |
| Purity | $\geq$99.9987% | 99.9994% |
| $CO_2$ | $\leq$1 ppm | $\leq$.5 ppm |
| CO | $\leq$5 ppm | $\leq$.5 ppm |
| $H_2$ | $\leq$2 ppm | $\leq$2 ppm |
| $O_2$ | $\leq$3 ppm | $\leq$.5 ppm |
| THC as Methane | $\leq$1 ppm | $\leq$1 ppm |

| | Bulk Grade | VLSI Grade |
|---|---|---|
| H₂O | ≦1 ppm | ≦1 ppm |

Proposed particle levels are ≦20 particles per cubic foot ≧.2 pm in diameter.

The inert gas is used both in purging the process chamber and the connected system gas lines before and after the reaction procedure, and in diluting the reactive gas and in preparing the water vapor laden inert gas which is mixed with the reactive gas to form the etchant medium. The inert gas may be the same or different inert gas as mentioned above. It is especially preferred in the present process that both the dry and the water vapor laden inert gases are nitrogen.

The reaction gas may be derived from any source which will provide a steady flow of anhydrous halogen-containing gas and which will remain in an entirely gaseous condition throughout the reaction system. Hydrogen fluoride is the preferred halogen-containing gas for use in this process. For instance, pure anhydrous hydrogen fluoride may be used as a source. Other sources of HF gas include the following two options: (1) A dilute liquid mixture of hydrogen fluoride and water (with or without ammonium fluoride) may be used as the source of gaseous hydrogen fluoride which readily volatilizes into a gaseous phase. Frequently, such a dilute liquid mixture may be 49% hydrogen fluoride and 51% water, but liquid mixtures containing a smaller proportion of hydrogen fluoride are also available commercially. (2) Bubbling a carrier gas (such as nitrogen) through solutions of various concentrations and temperatures of hydrofluoric acid and/or buffering agents.

An especially preferred source is anhydrous hydrogen fluoride stored as a liquid under its own vapor pressure. It is preferred due to control of reaction rate and uniformity of removal across the wafer surface.

Although, anhydrous hydrogen fluoride is the preferred gas used in the etchant process according to the present invention, other halogen containing gases can potentially be substituted. These may be such gases as anhydrous halogen gases, including chlorine, bromine, fluorine, and iodine, hydrohalogen gases, including hydrogen iodine, hydrogen bromide, and hydrogen chloride.

In the case of using anhydrous hydrogen iodide and hydrogen bromide, it is expected that somewhat elevated temperatures may be needed, under 200° C., in the processing chamber. Other gases may also require such elevated temperatures.

Other reactive gases that may be used in the present process may include hydrazine and ammonia, which are generally considered caustic gases; and other acid gases including carbon dioxide and oxides of nitrogen.

In the drawings, the wafer to be etched is indicated by the letter W and the face of the wafer being subjected to the etching or cleaning reaction is indicated by the letter F. As has been previously discussed, the films that may be on the face F of the wafer W that will be removed either completely or selectively may comprise silicon dioxide, polysilicon dioxide, silicon nitride, or others as previously mentioned in such instances where the wafer W is formed of silicon or polysilicon.

In the FIG. 1 there is illustrated a suitable apparatus for carrying out the process according to the present invention wherein the substrate to be etched is a single face F of a wafer W to be later processed into semi-conductor integrated circuit chips. A housing 10 is openable, to insert and remove a wafer W for etching, and closeable to form a sealed process chamber 12. Exhausts 13 are provided in the housing 10 of the process chamber 12 and are normally vented open to the atmosphere to allow for exit of the purging gas and the etching gas during the various phases of the process. The exhausts 13 are sufficiently open as to avoid creating any significant back pressure in the process chamber, but may incorporate a controllable throttle valve 13a to slightly throttle the gas flow and to slightly raise the pressure in chamber 12. The housing 12 may be constructed of any material which will be inert to the etchant gas under the process conditions. Suitable materials include, for example, stainless steel, ultra high molecular weight polyethylene, polypropylene, Teflon PFA, a trademark of E. I. DuPont DeNemours of Willmington, Del., for a plastic known as a perfluoroalkoxy. An especially preferred material for the housing is the Teflon PFA or the utra high molecular weight polyethylene.

The wafer W is supported on a horizontal turntable 14, so that its upper face F, which is being subjected to cleaning or etching is entirely free, clear and unobstructed. The turntable 14 is powered by a variable speed motor 15, which may be adjusted according to individual process conditions. Speeds of between about 1 and about 15 rpm are suitable, and a speed of about 6 rpm is preferred. Additional wafers W shown in dotted lines may be carried on the turntable for simultaneous etching.

A source of dry nitrogen 16 is provided, and it is important that the nitrogen source be of ultra high purity, for example, bottled chromatographic grade dry nitrogen. The source of nitrogen 16 is maintained at room temperature.

A source of gaseous hydrogen fluoride 17 is also provided. The hydrogen fluoride source may be supplied as a liquid in a cylinder, and then evaporated at a temperature sufficient to insure free flow of the gaseous hydrogen fluoride from the source. Alternately, instead of using a technical hydrogen fluoride, which is regarded as 99.99% pure, the anhydrous hydrogen fluoride, may be derived from bottled hydrogen fluoride which is 49% hydrogen fluoride and 51% water, suitably heated to drive off anhydrous hydrogen fluoride for use in the present process. A heating element 18 is provided beneath the bottle of hydrogen fluoride 17, or the heating element may wrap around or embrace the bottle of hydrogen fluoride. Heater 18 is connected to a control circuit 18.1 which supplies electrical energy to the heater and controls the temperature of the heater. The source of hydrogen fluoride is maintained at a suitable temperature as to be assured that the hydrogen fluoride is maintained in anhydrous gaseous condition. Accordingly, the supply anhydrous hydrogen fluoride is maintained at about 43° C.

A source of water 19 for water vapor generation is provided. The water source 19 should be of high purity, for example, deionized water.

An important component of the water vapor generation system is a vapor chamber 20. In an especially preferred embodiment, the vapor chamber 20 is approximately 1000 ml in volume, constructed of stainless steel. Around the outside of this vapor chamber 20 is a heating element 21 which allows heating of the vapor chamber 20 to any desired process temperature. Generally, the operating range for the vapor chamber 20 is in the range of about 45° C. to about 120° C. The heating element has electrical connections 21.1 extending therefrom and supplying electrical energy to the heating element and regulating the heating of it as to maintain the desired temperature in the vapor chamber.

Water to be vaporized is supplied into vapor chamber 20 through a metering diaphragm pump 22, operated by a solenoid 23. Solenoid 23 which controls operation of the metering diaphragm pump is connected to a control circuit 23.1 so that the operation of the diaphragm pump can be coordinated with the operation of the other portions of the system. The flow line 24 for the deionized water carries the metered water through a filter 25 and then to a control valve 26. The flow line 24 communicates with the interior of the vapor chamber 20 so that with each operation of the diaphragm pump 22 a spray or jet of water is directed into the vapor chamber 20. As the water is sprayed or jetted into the vapor chamber 20, the water is broken up into small droplets and subjected to the heat from the heater 21. A small quantity of nitrogen, carried into the vapor chamber 20 through a flow line 27 mixes with the water vapor formed in the vapor chamber 20 and serves to carry the water vapor out of the vapor chamber and into the flow duct or tube 28 for mixing with the dry nitrogen from source 16. Any portion of the spray of water not immediately put into vapor form will be collected during the cycle in the bottom of chamber 20 and the nitrogen from line 27 will bubble through it to add vapor into the flow.

Nitrogen is supplied into the flow line 27 from the nitrogen supply 16 which is connected to a manifold line 30. Nitrogen is supplied through the manifold line 30 to the branch line 27 for the vapor chamber 20 and also through another branch line 31. Nitrogen flow controls 32 and 33 are interposed in the flow ducts 31 and 27 respectively for regulating the flow of nitrogen through these lines. These flow controls may be adjusted to operate at various percentages of rated capacity from zero percent to one hundred percent, and may be supplemented by on-off valves in series. The flow control 32 has connection to a flow control circuit 32.1 which regulates flow through the flow control 32; and the flow control 33 also has connection to a flow control circuit 33.1 by which the flow through the flow control 33 is regulated. The flow control 32 operates throughout a wide range of flows, from 0 to 30.0 slm (standard liters per minute). The flow control 33 operates in the low range of flow of the nitrogen gas, from 0 to 2.0 slm.

The flow line 28 from the vapor chamber 20 is connected to the flow line 31 at a standard tee fitting 34 for mixing the water vapor laden nitrogen from vapor chamber 20 with the dry nitrogen flowing from the flow control 32 and through line 31.

At the tee fitting 34, the dry nitrogen from the flow control 32 is mixed with the water vapor laden nitrogen from the vapor chamber 20. The mixed dry and water vapor laden nitrogen is carried into a supply line or tube 35 and into a mixing device 36. The mixing device 36 may be any of a number of types of devices, but it has been found an aspirator operates satisfactorily for mixing the inert gases, carrying water vapor, with anhydrous reactive gas supplied through the flow line 37 which is connected into the aspirator 36.

The reactive gas in the flow line 37 will be in some cases anhydrous hydrogen fluoride from the source bottle 17. The flow line 38 from the supply bottle 17 is connected through an on/off valve 39 and through a filter 40 for supplying anhydrous hydrogen fluoride gas to the flow control 41 from which the measured amount of anhydrous hydrogen fluoride gas is flowed into the flow line 37 which contains another on/off valve 42. The flow control 41 is similar to flow controls 32 and 33 with the exception that the flow control 41 is adjusted to operate within a range 0 to 1.0 slm. The flow control 41 is connected to a circuit 41.1 which controls the flow of gas through the flow control and through the ducts 37 and 38.

The flow control 41 and the filter 40 and the flow line 38 between the flow control and the source bottle 17 of anhydrous hydrogen fluoride are all heated to maintain the anhydrous hydrogen fluoride gas in gaseous and anhydrous condition. The heating of these parts is produced by a heater plate 43 upon which the flow control 41 sits and upon which the filter 40 also sits. The filter 40 and the flow control 41 are heated and they conduct the heat to the flow lines 38 to maintain the hydrogen fluoride gas at desired temperature. The flow lines 37 and 38 are preferably short as to minimize the possibilities of condensation of the anhydrous hydrogen fluoride gas.

A nitrogen flow line 44 with an on/off valve 45 therein is connected into the flow line 27 between the vapor chamber 20 and the flow control 33, and is also connected into the nitrogen manifold line 30 for providing a purging shunt around the flow control 33.

Another flow line 46 is connected into the flow line 38 between the filter 40 and the valve 39 and is also connected into the nitrogen manifold 30, and incorporates an on/off valve 47 so that substantial volumes of nitrogen may be shunted through the flow control 41 and line 37 for purging this portion of the hydrogen fluoride flow system.

Alternative methods of generating a water vapor in the vapor chamber 20 may be used with equally desirable results. For example, an ultrasonic nozzle which uses a high frequency vibration to break up the stream of water passing through the nozzle into very fine water droplets may be used to generate the required vapor. Another alternative method of generating the water vapor is to aspirate a high pressure stream of water through a very small orifice nozzle into the vapor chamber 20. It will be understood that the water vapor produced by these alternatives need not be heated as in the preferred mode described. Another alternative for producing the vapor is to maintain a deionized water bath, unheated, or heated to temperatures in the range of 45° C. to 120° C. and then small quantities of dry nitrogen trickle or bubble through the bath or pass over the bath for picking up water vapor, carrying water vapor along to the mixing device 36. Such a bath may be long and narrow, with a surface area of approximately twenty four square inches or more.

In general, the etching process is carried out by mixing small quantities of anhydrous hydrogen fluoride gas with substantial quantities of dry inert nitrogen gas which acts as a diluent for the anhydrous hydrogen fluoride gas, and also mixing small quantities of water vapor laden nitrogen. The mixed gases are flowed into the process chamber 12 as to expose the film on the face F of the wafer W to the dilute reactive gas, and the small quantities of water vapor causes the reaction between the oxide film and the anhydrous reactive gas to be initiated and sustained through duration of the etch. The etching continues for from five to thirty seconds and the exhaust 13 is continuously opened to vent so that gases are continuously flowed out of the process chamber as well as into the chamber. Although the small quantities anhydrous reactive gas and of the water vapor laden nitrogen are both at temperatures somewhat above room temperature, the much larger quantities of dry nitrogen from the flow control 32 are at substantially room temperature so that the temperature in the process chamber is near room temperature during the etch process. While it is not considered essential that the wafer be rotated during the etch process, the rotation of the wafer is preferred unless thorough diffusing of the gases flowing through the chamber can be otherwise assured.

More specifically, at the beginning of a process cycle, a wafer W is placed in the process chamber which is thereafter closed, but continuously maintained open to the vent. Purging quantities of dry nitrogen are flowed through the mixing device 36 and through the process chamber 12 to clear other gases and contaminants from the process chamber; and purging nitrogen is also flowed through the on/off valve 47, filter 40, flow control 41, and flow line 37 as to purge all of the hydrogen fluoride gas from this part of the system and to assure that no liquid droplets remain in the system. Simultaneously substantial quantities of purging dry nitrogen are flowed through the flow control 33, and through the shunt line 44 into the vapor chamber 24 for purging all moisture and vapor from the vapor chamber 20 and the flow line 28, and of course as the purging by the nitrogen continues, all moisture and contaminants are removed from the processing chamber 12.

When the purging of the lines has been completed, valves 47 and 45 are closed, and small quantities of nitrogen will continue to flow through the vapor chamber 20. The metering diaphragm 22 is operated through a single cycle as to spray a small quantity of deionized water into the vapor chamber 20, as to be heated, vaporized and mixed with the flowing dry nitrogen therein and to be carried from the vapor chamber to the tee fitting 34 for mixing with the flowing dry nitrogen from flow control 32.

Immediately after the diaphragm pump 23 is operated as to commence the generation of a vapor in chamber 20, the on/off valve 39 is opened to flow the anhydrous hydrogen fluoride gas through heated flow lines and through the heated flow control 41, thereby supplying anhydrous hydrogen fluoride gas into the mixing device 36 whereupon the anhydrous hydrogen fluoride gas is mixed with small quantities of water vapor and with substantial quantities of the dry diluent nitrogen. This mixture of gases is introduced into the process chamber 12 and is applied onto the face of the wafer by flowing the gases through the chamber and over the wafer as the wafer is being revolved. After a suitable lapse of time during which etching continues at near normal atmospheric pressure, flow of the hydrogen fluoride and water vapor is terminated by closing valves 39 and 42 to stop the flow of hydrogen fluoride gas, and valve 29 to stop the water vapor flow, while the flow of dry nitrogen from flow control 32 is continued. The process chamber 12 is purged by hydrogen fluoride to quickly stop the etching process; and the valve 45 is opened as to complete the purge of the water vapor from the vapor chamber 20.

More specifically, it will be understood that the flow controls 32, 33 and 41 are all mass flow controllers and control the flow by mass.

In the carrying out of the process with the apparatus illustrated, and in etching the oxides worked with, flow control 33 is typically operated at forty percent of its capacity, producing a flow rate of approximately 0.8 slm. In each etching process, during which the face of one wafer is exposed to the etchant mixture, approximately 0.25 cc to 2.0 cc of deionized water is metered by the diaphragm pump 22 and sprayed into the vapor chamber 20. Typically, approximately 0.5 cc to about 1.5 cc of the deionized water is metered by the diaphragm pump and sprayed into the vapor chamber during each etching cycle. It is important that the flow of water vapor-laden nitrogen from the vapor chamber 20 be continued all during the time during which the anhydrous reactive gas is flowing, and accordingly, care is taken to be assured that water vapor-laden nitrogen is flowing from the vapor chamber for mixing with the dry nitrogen at a time prior to commencing flow of the anhydrous hydrogen fluoride gas and until the flow of the hydrogen fluoride gas is terminated.

The dry nitrogen flow control 32 accommodates flows within the range of 0 to 30 slm and the flow control is preferably operated in the range of 10 slm to about 20 slm. Typically, the flow control 32 is operated at approximately at fifty percent of its capacity, allowing flow of 15 slm.

The quantities of deionized water, as set forth, produce vapor, as to create humid conditions of from five to twenty-five percent relative humidity in flow line 35. Typically the humidity will be in the range of seven to ten percent relative humidity prior to entering the mixing device 36. With humidity in this approximate range, good etching results have been obtained.

Whereas the flow control 41 which regulates the flow of anhydrous hydrogen fluoride gas, operates within the range of 0 to 1.0 slm, the flow control 41 typically operates within the range thirty percent of capacity to ninety percent of capacity, thereby allowing flows of anhydrous hydrogen fluoride gas in the range of 0.3 slm to 0.9 slm.

The etching reaction is very fast with a total amount of the silicon dioxide, polysilicon dioxide, silicon nitride or other film removed depending upon the relative concentration of hydrogen fluoride in the etchant mixture. The etch rate with the parameters herein pointed out and using anhydrous hydrogen fluoride gas on such films is in the range of 100 to 14,000 angstroms per minute. Etching at a rate of up to 5,000 angstroms per minute is highly controllable and useful.

Taking into consideration that the hydrogen fluoride is thoroughly mixed in the mixing device with the water vapor laden nitrogen gas, the concentration of the mixture of gases as the gases enter the process chamber is approximately from 15 to 300 parts of water vapor nitrogen by mass to 1 part of hydrogen fluoride by mass, and preferably, the concentration is approximately about 30 parts of moist nitrogen to 1 part by hydrogen fluoride by mass.

As described above, the etching process involves a pre-purge, with the dry nitrogen gas, then the actual etching of the film from wafer W while the reactive gas is flowed into and through the process chamber, and finally a post purge after flow of the reactive gas is terminated.

In the etching process of removing silicon dioxide from the face of a silicon wafer, the resultant products are and remain in vapor form. The actual etching process is very complex, being comprised of several steps.

The formal mechanisms of reaction are not clear, but the experiments performed during the development of the process suggest the following explanation.

In the course of etching the surface, hydrogen fluoride vapors remove silicon dioxide by a chemical reaction which converts the solid $SiO_2$ to a gaseous form, probably $SiF_4$.

| Hydrogen Fluoride Vapors | Material to be Etched | Catalyst | Exhausted Reaction By-products |
|---|---|---|---|
| 4HF* | + $SiO_2$ | water vapor → | vapor $SiF_4$ + vapor $2H_2O$ |

NOTE:
A descriptive sequence, not necessarily the exact chemical reaction mechanism.
*This vapor could be in the form of dimer $(HF)_2$, hexamer $(HF)_6$, etc.

Water vapor acts as a catalyst to the reaction through formation of some intermediate.

The vapor products of this reaction are swept out of the chamber by the inert gas, completing the removal of the silicon dioxide. Water vapor is needed for etch rate uniformity.

Numerous silicon wafers with silicon oxide films thereon have been etched as to remove the films from the faces of the wafers or to remove a portion of the film.

Also nitride films may be etched and have a much slower etch rate than does silicon dioxide, at approximately ten percent of the silicon oxide etch rate.

The portions of the films which have been removed have been measured by state-of-the-art apparatus familiar to persons of skill in this art and measured in angstroms. In all of the examples hereafter described, the flow controller regulating the flow of anhydrous hydrogen fluoride gas was maintained to a temperature sufficient to prevent condensation of hydrogen fluoride gas, or about 43° C.; and the hydrogen fluoride source was similarly heated to create hydrogen fluoride vapor and avoid any hydrogen fluoride condensation in the flow lines. Also, the process chamber was continuously opened to vent to maintain a near normal atmospheric pressure in the process chamber; and no heat was added to the process chamber, apart from the gases being flowed into it.

In the etching process, the etchant mixture flows through the process chamber 12 and is vented through the exhaust 13 which remains open to the atmosphere or slightly throttled to slightly increase pressure in the process chamber. The present process realizes extremely high etch rates so that no holding time of the etchant mixture in the process chamber 12 is required to complete the process. After the charging of the process chamber 12 is complete, valves 47 and 28 are closed while the flow of dry nitrogen continues to flow through the system, purging lines 24, 25 and 43, vapor chamber 41, mixing chamber 50 and process chamber 12 of the etchant mixture.

EXAMPLE I

In this example, silicon wafers with silicon oxide films were etched in the process wherein all of the parameters were held constant excepting the flow rate of anhydrous hydrogen fluoride gas which was progressively increased, thereby progressively increasing the concentration of the anhydrous hydrogen fluoride gas applied to the wafers. Flow of dry nitrogen was held at 15 liters per minute; 1 cc of deionized water was injected into the vapor chamber for each wafer processed; the vapor chamber was held at 120° C.; and the nitrogen sweep through the vapor chamber was a rate of 0.8 liters per minute. With this rate of water injection and sweep through the vapor chamber, approximately nine percent relative humidity in flow line 35 is experienced. The wafer was rotated at six r.p.m. It was observed through the use of transparent flow lines from the vapor chamber, that sufficient water vapor was available so that water vapor was supplied into the gas mixture for the process chamber all during the flow of anhydrous hydrogen fluoride gas in each cycle. Process chamber pressure was at or slightly above atmospheric pressure by a small amount caused by producing continuous flow through the chamber. The vent was not intentionally throttled. Etch time or duration of the flow of the anhydrous hydrogen fluoride gas was maintained at 8 seconds per wafer etched. The following TABLE I of twenty-four etch cycles demonstrates the controllability and repeatability of the etching as disclosed.

TABLE I

| | FILM THICKNESS | | |
|---|---|---|---|
| HF Flow Rate, 1/min. | Initial Thickness Angstroms | Average Removal $x$ | Standard Deviation In Removal $s$ |
| 0.50 | 4948 | 365.17 | 33.75 |
| | 4630 | | |
| | 4274 | | |
| | 4905 | | |
| | 4496 | | |
| | 4143 | | |
| 0.55 | 4844 | 648.17 | 127.36 |
| | 3979 | | |
| | 3389 | | |
| | 4836 | | |
| | 4178 | | |
| | 3699 | | |
| 0.75 | 4827 | 1077.75 | 86.55 |
| | 3864 | | |
| | 4823 | | |
| | 3710 | | |
| 0.85 | 4827 | 1330.75 | 77.17 |
| | 3612 | | |
| | 4820 | | |
| | 3452 | | |
| 0.90 | 5057 | 1435.50 | 24.41 |
| | 3623 | | |
| | 4920 | | |
| | 3472 | | |

EXAMPLE II

In this example all of the parameters of the etching processes were maintained constant with the exception of the time of the etch. The nitrogen flow rate was maintained at 15 liters per minute; the flow rate of the anhydrous hydrogen fluoride gas was maintained at 0.5 liters per minute; water was metered into the vapor chamber at a rate of 1 cc of deionized water per etching cycle, i.e. for each wafer; the vapor chamber was maintained at 120° C.; and the sweep of nitrogen through the vapor chamber was maintained at a rate of 0.8 liters per minute. The wafer was revolved at a rate of six r.p.m. It was observed, through the use of transparent flow lines from the water vapor chamber that sufficient vapor was available so that water vapor was supplied into the gas mixture for the process chamber all during the flow of anhydrous hydrogen fluoride in each cycle.

Table II reports results of twenty-seven etching cycles, and demonstrates the controllability and repeatability of the process.

TABLE II

| Etch Time Seconds | FILM THICKNESS Initial Thickness Angstroms | Average Removal x | Standard Deviation In Removal s |
|---|---|---|---|
| 8 sec. | 4948 | 365.17 | 33.17 |
|  | 4630 |  |  |
|  | 4274 |  |  |
|  | 4905 |  |  |
|  | 4496 |  |  |
|  | 4143 |  |  |
| 12 sec. | 5032 | 1039.14 | 47.55 |
|  | 4061 |  |  |
|  | 3078 |  |  |
|  | 1971 |  |  |
|  | 5004 |  |  |
|  | 3936 |  |  |
|  | 2885 |  |  |
| 16 sec. | 4959 | 1562.50 | 13.44 |
|  | 3406 |  |  |
| 20 sec. | 4941 | 2012.50 | 6.36 |
|  | 2933 |  |  |
| 25 sec. | 4926 | 2586.00 | 82.93 |
|  | 4914 |  |  |
|  | 4901 |  |  |
| 30 sec. | 4913 | 3301.29 | 103.79 |
|  | 4875 |  |  |
|  | 4875 |  |  |
|  | 4870 |  |  |
|  | 4860 |  |  |
|  | 5581 |  |  |
|  | 5565 |  |  |

EXAMPLE III

In this Example the amount of oxide film or removal was measured at five places on each wafer, at the center, and adjacent the edge at four locations approximately equally spaced about the periphery, referred to as a top, middle, bottom, left and right. All of the parameters were maintained constant, a series of wafers were etched and the film removal at the five locations on each wafer was measured. The flow control for the anhydrous HF gas was adjusted to fifty percent of capacity, or 0.5 slm. The etch continued for 12 seconds; the water vapor continued for 12 seconds; the anhydrous HF source bottle was heated to 30° C.; the anhydrous HF gas flow control was heated to 40° C.; the dry nitrogen flow control was adjusted to fifty percent capacity or 15 slm; and the nitrogen sweep through the vapor chamber was adjusted to forty percent, or 0.8 slm water vapor flow continued all during flow of anhydrous hydrogen fluoride gas. Table III demonstrates the controllability, repeatability and uniformity of the etchant various locations on the faces of the wafers.

TABLE III

| Wafer Number | FILM THICKNESS Initial Thickness Angstrom | Average Removal x | Standard Deviation In Removal s |
|---|---|---|---|
| 1 | 4992(T) | 739.80 | 19.92 |
|  | 4915(M) |  |  |
|  | 4901(B) |  |  |
|  | 4914(L) |  |  |
|  | 4890(R) |  |  |
| 2 | 4268(T) | 680.40 | 36.07 |
|  | 4178(M) |  |  |
|  | 4132(B) |  |  |
|  | 4194(L) |  |  |
|  | 4141(R) |  |  |
| 3 | 3649(T) | 759.80 | 45.03 |
|  | 3486(M) |  |  |
|  | 3418(B) |  |  |
|  | 3510(L) |  |  |
|  | 3448(R) |  |  |
| 4 | 2965(T) | 734.80 | 12.05 |
|  | 2705(M) |  |  |
|  | 2615(B) |  |  |
|  | 2744(L) |  |  |
|  | 2685(R) |  |  |
| 5 | 2244 | 714.20 | 37.06 |
|  | 1966 |  |  |
|  | 1868 |  |  |
|  | 2000 |  |  |
|  | 1962 |  |  |
| 6 | 8435(T) | 630.80 | 99.07 |
|  | 8336(M) |  |  |
|  | 8357(B) |  |  |
|  | 8185(L) |  |  |
|  | 8176(R) |  |  |
| 7 | 7746(T) | 635.80 | 62.31 |
|  | 7633(M) |  |  |
|  | 7645(B) |  |  |
|  | 7689(L) |  |  |
|  | 7622(R) |  |  |
| 8 | 7162(T) | 739.60 | 27.30 |
|  | 6966(M) |  |  |
|  | 6998(B) |  |  |
|  | 7125(L) |  |  |
|  | 6905(R) |  |  |

ADDITIONAL EXAMPLES

Extremely rapid removal of the oxide film was experienced when anhydrous hydrogen fluoride gas was used without the diluent nitrogen gas, but with the nitrogen sweep through the vapor generator at a rate of 0.6 to 0.7 slm with the amount of water vapor produced by a spray of at least 0.3 cc of deionized water per operational cycle, or per wafer. The oxide was removed from the wafer shortly after 3 seconds of etch time, in the amount of 5,000 to 6,000 angstroms of thickness. The temperature of the anhydrous hydrogen fluoride gas supplied to the process chamber was approximately 40° C. at the flow control.

In another example, wafers with doped film, exhibiting hydroscopic characteristics and with moisture adsored into the film, were etched with a concentration of ten to fifteen percent anhydrous hydrogen fluoride gas to diluent dry nitrogen gas, but without any added water vapor. The etch time was 20 to 30 seconds and in excess of 1,000 angstroms were stripped from the wafer.

In still another example with flow control 33 set at twenty-five percent for a 0.5 slm nitrogen flow, and flow control 32 set at fifty percent for a 15 slm flow of dry nitrogen, and water vapor generated to establish seven percent relative humidity in flow line 35, good etching results were obtained with flows of anhydrous hydrogen fluoride in the ranges previously set forth.

Likewise satisfactory etch results were obtained when flow rates were changed to 0.6 slm nitrogen sweep through the vapor chamber, 15 slm dry nitrogen and seven percent relative humidity measured at line 35, together with ranges of flow of anhydrous hydrogen fluoride as previously set forth.

In another example, the throttle valve 13.1 was adjusted to restrict flow to the vent and thereby increase pressure in the process chamber to about 23 inches of water, and with the ratios of flow of nitrogen to flow of anhydrous hydrogen fluoride gas in the range of 35 or 40 to 1, water vapor generated by bubbling gas through an unheated water bath and producing a relative humidity of 22 to 23 percent in the combined gases entering the process chamber, etch rates of approximately 3000 angstroms in 18 seconds, or about 10,000 angstroms per minute were achieved.

Figure 2:
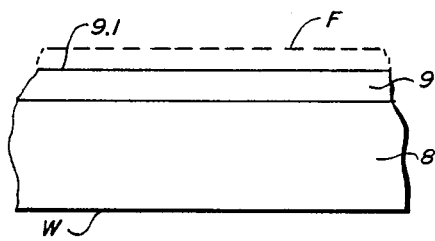
FIG. 2 is a diagrammatic illustration of a substrate with a portion of the etchable film removed according to the disclosed process.
Figure 3:
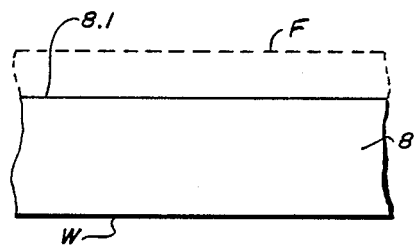
FIG. 3 is a diagrammatic illustration of a substrate with a face from which an etchable film has been removed according to the disclosed process.

The wafer W which has been subject to the etching process is illustrated in FIGS. 2 and 3. The original face F of the wafer is indiciated in dashed lines. The substrate 8 of the wafer may be of any of the materials indicated, but most often is of silicon. The etchable film 9 on the substrate may be partially removed by the etch as illustrated in FIG. 2 to define a new face 9.1 or the film 9 may be entirely removed by the etch as to expose the face 8.1 of the substrate. As pointed out above, the surfaces 8.1 and 9.1 are smooth upon completion of the etch, without damage or roughening of the surface due to the etch; and there is an increased level of free fluorine atoms on surfaces 8.1 and 9.1 after completion of the etch. Furthermore, in geometry etching, narrow line widths will be formed, and the films substrate will have straight walls at the boundary of the masked areas without undercutting.

That which is claimed is:

1. A gaseous process of removing and vaporizing at least a portion of a film from a substrate, comprising exposing the substrate to an anhydrous reactive gas in the presence of water vapor.

2. The process according to claim 1 wherein the exposing of the substrate is also in the presence of dry diluent inert gas.

3. The process according to claim 2 wherein the inert gas is at near room temperature.

4. The process according to any of claims 1 or 2 or 3 wherein the exposing of the substrate is at near normal atmospheric pressure.

5. The process according to claim 1 wherein the exposing of the substrate is also in the presence of dry diluent inert gas at near room temperature and at near normal atmospheric pressure.

6. The process according to claim 1 wherein the reactive gas is an anhydrous hydrogen halide.

7. The process according to claim 1 wherein the reactive gas is anhydrous hydrogen fluoride.

8. A gaseous process of removing and vaporizing at least a portion of a film from a substrate, comprising exposing the substrate to an anhydrous hydrogen halide gas in the presence of water vapor.

9. A process according to claim 8 wherein the exposing of the substrate is also in the presence of dry diluent inert gas.

10. A process according to claim 8 wherein the exposing of the substrate is at near room temperature.

11. A process according to any of claims 8, 9 or 10 wherein the exposing of the substrate is at near normal atmospheric pressure.

12. A process according to claim 8 wherein the exposing of the substrate is in the presence of dry diluent inert gas at near room temperature and at near normal atmospheric pressure.

13. A process according to claim 8 wherein the hydrogen halide gas is anhydrous hydrogen fluoride.

14. A gaseous process of removing and vaporizing at least a portion of a film from a substrate, comprising exposing the substrate to anhydrous hydrogen fluoride gas in the presence of water vapor.

15. The process according to claim 14 wherein the exposing of the substrate is also in the presence of dry diluent inert gas.

16. The process according to claim 15 wherein the inert gas is at near room temperature.

17. A process according to any of claims 14 or 15 or 16 wherein the exposing of the substrate is at near normal atmospheric pressure.

18. A process according to any of claims 14 or 15 or 16 wherein the exposing of the substrate is carried out under pressure conditions of up to thirty-five inches of water.

19. A process according to claim 14 wherein the substrate comprises a silicon wafer and the exposing of the substrate is also in the presence of dry diluent inert gas at near room temperature and at near normal atmospheric pressure.

20. A process according to claim 15 wherein the inert gas comprises dry nitrogen.

21. A process according to claim 15 wherein the film comprises an oxide of the material of the substrate.

22. A process according to claim 15 wherein the film comprises a nitride of the material of the substrate.

23. A process according to claim 15 wherein the substrate comprises a silicon wafer with the film on one face thereof.

24. A process according to claim 15 wherein the substrate comprises a carrier boat with film on numerous faces thereof.

25. A process according to claim 16 and heating the anhydrous hydrogen fluoride gas above room temperature as the gas is delivered to the substrate.

26. A process according to claim 15 and simultaneously exposing a plurality of substrates to said anhydrous hydrogen fluoride gas in presence of said vapor and said inert gas.

27. A process according to claim 14 wherein the water vapor is carried by inert gas to the anhydrous hydrogen fluoride gas to establish the presence of water vapor therein.

28. A process according to claim 27 wherein the vapor is heated above room temperature.

29. A process according to claim 27 wherein the vapor is at near room temperature.

30. A process according to claim 28 wherein the vapor is heated to a temperature in a range of 45° C. to 120° C.

31. A process according to any of claims 15 or 16 or 27 wherein the exposing of the substrates continues for a time period within the range of five seconds to thirty seconds.

32. A process according to claim 15 and mixing the water vapor and inert gas with the anhydrous hydrogen fluoride gas prior to exposing the substrates to the anhydrous fluoride gas.

33. A process according to claim 15 wherein the relative concentration of dilute inert gas to anhydrous hydrogen fluoride gas is up to 300 parts of inert gas by mass to 1 part of anhydrous hydrogen fluoride gas by mass.

34. A process according to claim 15 wherein the concentration of the anhydrous hydrogen fluoride gas is within the range of 0.1 mole percent to 25.0 mole percent of all of the gas to which the substrate is exposed.

35. A process according to claim 15 and varying the relative amounts of anhydrous hydrogen fluoride gas and dry diluent inert gas to change the rate of removal of the film.

36. A process according to claim 14 and continuing the presence of water vapor all during the exposing of the substrate to anhydrous hydrogen fluoride gas.

37. A process according to claim 15 wherein the anhydrous hydrogen fluoride gas and water vapor and dry diluent inert gas are simultaneously flowed over the film on the substrate.

38. A process according to claim 37 wherein the concentration of dry diluent inert gas to anhydrous fluoride gas is up to 300 parts of inert gas by mass to one part of anhydrous hydrogen fluoride gas by mass and the dry inert gas is flowed at near room temperature and at a rate within the range of 1 slm to 30 slm, and additional inert gas flows at a rate of 0.2 slm to 2.0 slm and carries the vapor formed from vaporizing from at least a portion from 0.3 cc to 2.0 cc while the exposing of the substrate continues for a time within the range of five to thirty seconds and at near normal atmospheric pressure.

39. A process according to claim 37 and continuously exhausting the flowing gases and vapor away from the substrate.

40. A process according to claim 37 and discontinuing the flow of anhydrous hydrogen fluoride gas while continuing the flow of diluent inert gas to stop the removal of film.

41. A process according to claim 15 and revolving the substrate while exposing of the substrate continues.

42. A gaseous process of removing and vaporizing at least a portion of a hygroscopic film from a substrate, said hygroscopic film having moisture absorbed therein, comprising exposing the film to an anhydrous reactive gas.

43. A process according to claim 42 wherein the exposing of the film to the reactive gas is also in the presence of dry diluent gas.

44. A process according to either of claims 42 or 43 wherein the reactive gas comprises an anhydrous hydrogen halide.

45. A process according to 44 wherein the reactive gas comprises anhydrous hydrogen fluoride.

46. A process according to claim 45 wherein the exposing of the film is at near room temperature and at near normal atmospheric pressure.

47. Apparatus for processing a substrate for cleaning or etching film therefrom, comprising
a process chamber to confine the substrate and having a vent continuously open to atmosphere,
a gas mixing means connected in fluid communicating relation to the process chamber for supplying mixed gases into the process chamber,
means for connection to sources of anhydrous reactive gas, water vapor and dry inert gas and metering relative flows from said sources to the said gas mixing means to be delivered into the processing chamber to produce reaction with the film on the substrate.

48. Apparatus for processing a substrate for cleaning or etching film therefrom, comprising
a process chamber to confine the substrate and having a vent continuously open to atmosphere,
a gas mixing means connected in fluid communicating relation to the process chamber for supplying mixed gases into the process chamber,
source means of anhydrous reactive gas, water vapor and dry inert gas,
and flow means connecting said source means to the gas mixing means and metering relative flows of the reactive gas, water vapor and dry inert gas to the gas mixing means for delivery into the processing chamber to produce reaction with the film on the substrate.

49. Apparatus for processing a substrate according to claim 48 and the flow means for the reactive gas being valved.

50. Apparatus for processing a substrate according to either of claims 47 or 48 wherein the anhydrous reactive gas at the source means comprises anhydrous hydrogen fluoride.

51. Apparatus for processing a substrate according to either of claims 47 or 48 and the vent including flow throttling means for increasing the gas pressure in the process chamber.

52. Apparatus for processing a substrate according to claim 48 and the source means of water vapor having a water spray means and said flow means directing inert gas through the spray produced.

53. Apparatus for processing a substrate according to claim 48 and the source means of water vapor having a bath of water and said flow means directing inert gas bubbling through the bath.

54. Apparatus for processing a substrate for cleaning or etching film therefrom, comprising
a process chamber to confine the substrate and having a vent continuously open to atmosphere,
a gas mixing means connected to fluid communicating relation to the process chamber for supplying mixed gases into the process chamber,
a first source of anhydrous reactive gas having connection to the gas mixing means,
a second source of dry inert gas,
a third source of water vapor,
means connecting the second and third sources to the gas mixing means for mixing inert gas and water vapor with the reactive gas and to be delivered therewith into the processing chamber to produce reaction with the film on the substrate.

55. A process according to claim 1, wherein the anhydrous reactive gas is selected from reactive gases capable of providing a steady flow of anhydrous halogen-containing gas, and hydrazine, ammonia, carbon dioxide and oxides of nitrogen.

56. A process according to claim 42, wherein the anhydrous reactive gas is selected from reactive gases capable of providing a steady flow of anhydrous halogen-containing gas, and hydrazine, ammonia, carbon dioxide and oxides of nitrogen.

57. A process of removing at least a portion of a film from a substrate, comprising flowing anhydrous hydrogen fluoride gas and water vapor over the substrate and film, the anhydrous hydrogen fluoride gas and water vapor being supplied from separate controlled sources, terminating the flow of the anhydrous hydrogen fluoride gas and vapor over the substrate and film, and continuously flowing dry inert diluent gas over the substrate and film before, during and after flowing the anhydrous hydrogen fluoride gas and vapor over the substrate and film.

58. A process of removing at least a portion of a film from a substrate according to claim 57 wherein the vapor is flowing prior to commencing flow of the anhydrous hydrogen fluoride gas.

59. A process of removing at least a portion of a film from a substrate according to claim 57 and varying the relative flows of anhydrous hydrogen fluoride gas, vapor and dry inert diluent gas relative to each other for controlling the removal of film.

* * * * *

UNITED STATES PATENT AND TRADEMARK OFFICE
CERTIFICATE OF CORRECTION

PATENT NO. : 4,749,440

DATED : June 7, 1988

INVENTOR(S) : Robert S. Blackwood; Rex L. Biggerstaff; L. Davis Clements; Rinn Cleavelin It is certified that error appears in the above-identified patent and that said Letters Patent is hereby corrected as shown below:

Column 7, line 16, delete "reaction" and insert --reactive--.

Column 11, line 62, delete "by" and insert --of--.

Column 16, lines 50 and 51, delete "adsored" and insert --adsorbed--.

Signed and Sealed this

First Day of November, 1988

Attest:

DONALD J. QUIGG

Attesting Officer

Commissioner of Patents and Trademarks